United States Patent
Takagi et al.

(10) Patent No.: US 9,478,742 B2
(45) Date of Patent: Oct. 25, 2016

(54) ELECTROLUMINESCENCE DEVICE AND MANUFACTURING METHOD THEREOF

(71) Applicant: Japan Display Inc., Tokyo (JP)

(72) Inventors: Jun Takagi, Tokyo (JP); Toshihiro Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/471,025

(22) Filed: Aug. 28, 2014

(65) Prior Publication Data

US 2015/0060820 A1 Mar. 5, 2015

(30) Foreign Application Priority Data

Aug. 30, 2013 (JP) ................. 2013-180435

(51) Int. Cl.
| | | |
|---|---|---|
| H01L 51/50 | (2006.01) | |
| H01L 21/31 | (2006.01) | |
| H01L 51/56 | (2006.01) | |
| H01L 51/00 | (2006.01) | |
| H01L 51/52 | (2006.01) | |
| H01L 27/32 | (2006.01) | |

(52) U.S. Cl.
CPC ....... *H01L 51/0021* (2013.01); *H01L 27/3246* (2013.01); *H01L 51/5209* (2013.01); *H01L 51/5218* (2013.01)

(58) Field of Classification Search
CPC ............ H01L 27/124; H01L 27/3244; H01L 27/1225; H01L 29/7869; H01L 27/1255; H01L 27/3246; H01L 28/4908; H01L 27/1285; H01L 29/78627; H01L 27/12; H01L 27/3234; H01L 25/075; H01L 27/15; H01L 33/08; H01L 33/00; H01L 25/0756; H01L 25/046; H01L 2251/00; H01L 2031/0344; H01L 27/28; H01L 51/00; H01L 35/00; H01L 37/00; H01L 41/00; H01L 31/07; H01S 5/026
USPC ........................................ 313/505, 506, 509
See application file for complete search history.

(56) References Cited

U.S. PATENT DOCUMENTS 6,828,725 B2 * 12/2004 Kimura ............... H01L 51/5271
    313/505
6,861,279 B2 * 3/2005 Nakanishi ............... H01L 27/12
    257/E27.111

(Continued)

FOREIGN PATENT DOCUMENTS

| CN | 1454035 A | 11/2003 |
|---|---|---|
| JP | 2007-288143 A | 11/2007 |

(Continued)

OTHER PUBLICATIONS

Korean Office Action mailed Jan. 5, 2016 for corresponding KR patent application No. 10-2014-0111353.

(Continued)

*Primary Examiner* — Mary Wilczewski
*Assistant Examiner* — Tsz Chiu
(74) *Attorney, Agent, or Firm* — Typha IP LLC

(57) ABSTRACT

Light emitted within an organic EL device is effectively utilized, and a pixel is provided for improving the extraction efficiency of the light. Light extraction is efficiency is improved without increasing a current by effectively utilizing guided wave light which is a cause of the loss of light emitted by an organic EL device. In order to achieve this, a stepped portion is arrange in an insulating layer provided over a lower layer of a first electrode including a light reflecting surface, and a peripheral area of the first electrode is formed so as to contact the stepped portion. The reflecting surface is formed curved towards a second electrode side in the peripheral area of the first electrode from the stepped portion, light guided through the organic EL layer is reflected by the reflecting surface and emitted from the second electrode side.

15 Claims, 15 Drawing Sheets

(56) References Cited

U.S. PATENT DOCUMENTS

| | | |
|---|---|---|
| 2003/0197466 A1 | 10/2003 | Yamazaki et al. |
| 2004/0160165 A1* | 8/2004 | Yamauchi ........... H01L 27/3246 313/498 |
| 2005/0285512 A1* | 12/2005 | Murayama .......... H01L 27/3246 313/504 |
| 2006/0034566 A1* | 2/2006 | Wakita ................. G02B 6/0038 385/31 |
| 2008/0143649 A1 | 6/2008 | Asaki et al. |
| 2011/0147777 A1 | 6/2011 | Konno et al. |
| 2011/0175102 A1* | 7/2011 | Hatano ............... H01L 51/5243 257/72 |
| 2013/0001603 A1 | 1/2013 | Lim et al. |

FOREIGN PATENT DOCUMENTS

| | | |
|---|---|---|
| JP | 2011-124103 A | 6/2011 |
| KR | 10-2013-0007421 A | 12/2015 |
| TW | 201332095 A1 | 8/2013 |

OTHER PUBLICATIONS

Taiwanese Office Action mailed Dec. 21, 2015, for corresponding TW patent application No. 103126813.

Chinese Office Action dated Apr. 29, 2016 for corresponding Chinese Application No. 201410437121.2.

Taiwanese Office Action dated Apr. 27, 2016 for corresponding Taiwanese Application No. 103126813.

* cited by examiner

ELECTROLUMINESCENCE DEVICE AND MANUFACTURING METHOD THEREOF

CROSS REFERENCE TO RELATED APPLICATIONS

This application is based upon and claims the benefit of priority from the prior Japanese Patent Application No. 2013-180435, filed on Aug. 30, 2013, the entire contents of which are incorporated herein by reference.

FIELD

An embodiment of the present invention is related to an electroluminescence device, for example, one embodiment of the invention relates to a useful technique when applied to electroluminescent devices having a top emission structure.

BACKGROUND

Electroluminescent device using electroluminescence organic materials (also referred to as "organic EL device") can realize emitted light of each color in the visible light range by selecting an organic material or by adopting an appropriate organic EL device structure and emitting white light. As a result, the development of electroluminescence devices suitable for purposes such as displays or lighting using an organic EL device is progressing.

An organic EL device is formed by stacking a transparent electrode such as ITO (Indium Tin Oxide), an organic electroluminescence layer (referred to below as "organic EL layer") formed from a hole transport layer, a light emitting layer or electron transport layer and the like, and a reflective electrode, wherein light emitted in the organic EL layer is irradiated by passing through the transparent electrode. The thickness of the organic EL layer is about 100 nm to 200 nm and the light emitting by the light emitting layer spreads in all directions of $4\pi$ when expressed as a solid angle. In addition, light emitted straight to/from a glass substrate side and a part of the light reflected at a boundary between the reflective electrode and organic EL layer is emitted to the glass substrate side.

However, light emitted in parallel to a film surface within the organic EL layer heads towards an end surface of the organic EL layer and is not emitted from the transparent electrode side. In the organic EL device, the refractive index of a material which forms the organic EL layer is high (n=1.8~1.9), and light entering at a specific angle at a boundary surface with a different refractive index is all reflected. For example, all the light which is reflected at a boundary surface between the organic EL layer and transparent electrode, and at a boundary surface between a glass substrate and air is either wave guided through the interior of the organic EL layer or glass substrate and absorbed within the layers or is emitted from the end surface of the glass substrate so that the emitted light cannot be effectively utilized.

Due to the light which is wave guided through the interior of the organic EL layer, the extraction efficiency (ratio of the amount of light emitted to the glass substrate side to the total amount of emitted light in the organic EL layer) of light generated in the organic EL layer is said to be about 20%. Increasing the extraction efficiency of light generated in the organic EL layer is important for reducing power consumption of an electroluminescence device formed using an organic EL device.

For example, a technology for improving the extraction efficiency by arranging a transparent resin layer between a transparent electrode and a glass substrate of an organic EL device, and burying a cone shaped transparent resin with a different refractive index within the transparent resin layer is disclosed in Japanese Laid Open Patent 2011-124103. In addition, a technology for improving the extraction efficiency by forming a metal electrode having a unique surface obtained by forming a concave-convex surface into a curved surface shape into a reflective electrode of a light emitting device is disclosed in Japanese Laid Open Patent 2007-288143.

However, using a unique optical adjustment film on a light emitting side of an organic EL device as is disclosed in Japanese Laid Open Patent 2011-124103 in order to improve the extraction efficiency is the cause of an increase in costs which is not desirable. In addition, forming a metal electrode having a unique concave-convex surface as a reflective electrode of an organic EL device as is disclosed in Japanese Laid Open Patent 2007-288143 leads to complex manufacturing processes which is also not desirable.

Although it is possible to increase luminosity when light is emitted if a current flowing to an organic EL device is increased, this becomes a problem from the viewpoint of energy conservation since power consumption is also increased by this amount. In addition, the larger the value of a current flowing to an organic EL device, the more the organic EL device deteriorates leading to a reduction in the lifetime of the electroluminescence device.

SUMMARY

An electroluminescence device according to one embodiment of the present invention includes an insulating layer over of a substrate, a first electrode including a light reflecting surface over the insulating layer, a bank layer covering a peripheral area of the first electrode, an electroluminescence layer over the first electrode, and a second electrode having an optical transparency over the electroluminescence layer, the insulating layer includes a stepped portion having a tilted surface curved towards the second electrode side in the peripheral area of the first electrode, and the peripheral area of the first electrode is provided along the tilted surface of the stepped portion.

An electroluminescence device according to one embodiment of the present invention includes a pixel region having a plurality of pixels arranged in a matrix; the pixel including a thin film transistor, a first electrode including a light reflecting surface connected to the thin film transistor, an electroluminescence layer over the first electrode, and a second electrode having an optical transparency over the electroluminescence layer; the thin film transistor includes an insulating layer provided to contact the first electrode, and a bank layer covering a peripheral area of the first electrode, the insulating layer includes a stepped portion having a tilted surface curved towards the second electrode side in the peripheral area of the first electrode, and the peripheral area of the first electrode is provided along the tilted surface of the stepped portion.

A manufacturing method of an electroluminescence device according to one embodiment of the present invention includes forming a stepped portion over a substrate, the stepped portion having a first main surface and a second main surface located higher than then the first main surface, and a tilted surface provided between the first main surface and the second main surface, the tilted surface widening towards the second main surface from the first main surface, forming a first electrode including a light reflecting surface along the tilted surface of the stepped portion from the first main surface of the insulating layer, forming a bank layer covering a peripheral area of the stepped portion and the first electrode, forming an electroluminescence layer over the first electrode, and forming a second electrode having an optical transparency over the electroluminescence layer.

A manufacturing method of an electroluminescence device according to one embodiment of the present invention includes forming a thin film transistor over a substrate, forming an insulating layer including a stepped portion over the thin film transistor, the stepped portion having a first main surface and a second main surface located higher than then the first main surface, and a tilted surface provided between the first main surface and the second main surface, the tilted surface widening towards the second main surface from the first main surface, forming a contact hole opening a source and drain area of the thin film transistor in the insulating layer, forming a first electrode including a light reflecting surface along the tilted surface of the stepped portion from the first main surface of the insulating layer; and electrically connected with the thin film transistor in the contact hole, forming a bank layer covering a peripheral area of the stepped portion and the first electrode, forming an electroluminescence layer over the first electrode, and forming a second electrode having optical transparency over the electroluminescence layer.

DESCRIPTION OF EMBODIMENTS

Figure 1A:
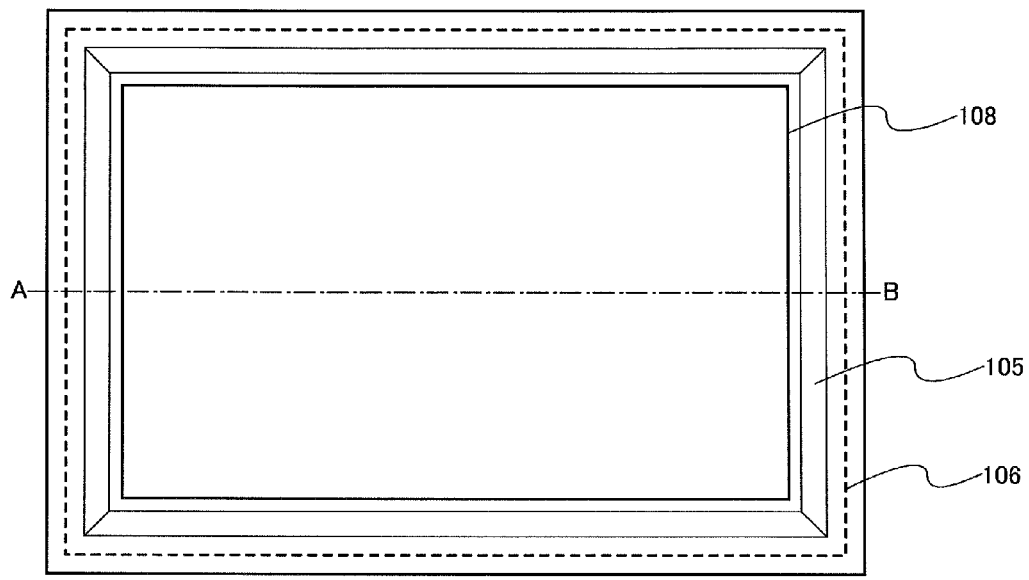
FIG. 1A shows a planar view of an electroluminescence device related to one embodiment of the present invention.

The embodiments of the present invention are explained below while referring to the drawings. However, the present invention can be realized by many different forms and should not be interpreted as being limited to the details of the descriptions in the embodiments exemplified herein.

Furthermore, with regards to the contents of the invention explained herein, the same reference symbols are commonly used between different drawings for the same parts or parts having the same function and as long as there are no particular circumstances that require it, repeated explanations are omitted. In addition, although a circuit layer is usually formed between a substrate and an insulating layer or between an insulating layer and organic layer, in the present embodiment the circuit layer is sometimes omitted for the purpose of simplifying explanation of the characteristics of the invention.

In the present specification, in the case where certain components or areas are present "over" or "under" and "above" or "below" other components or areas, as long as there are no particular limitations, this includes not only the case where components or areas are directly above or directly below other components or areas but also the case where components or areas are above or below other components or areas with other structural components provided in between.

[First Embodiment]

Figure 1B:
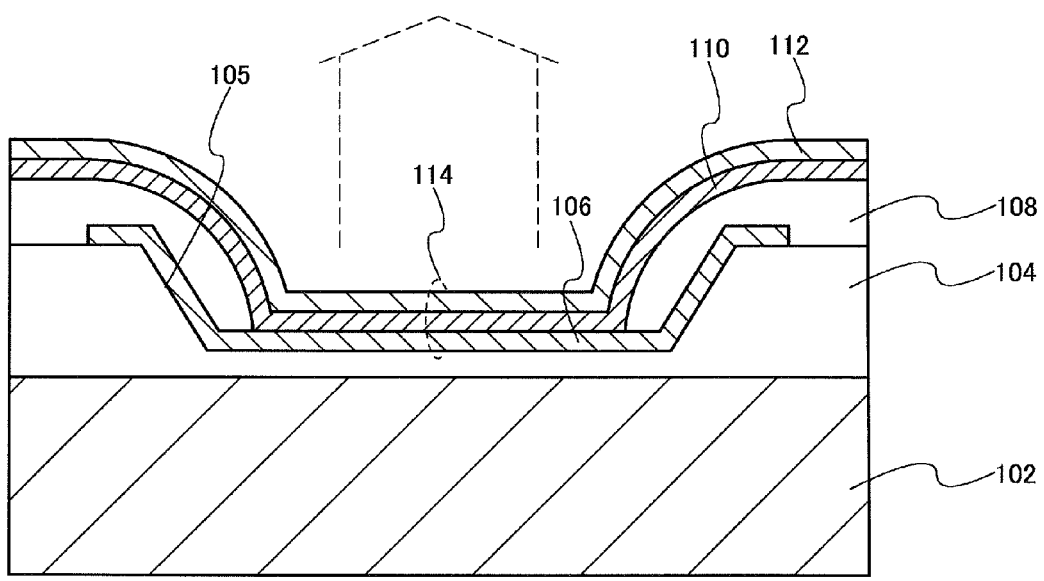
FIG. 1B shows a cross sectional view of an electroluminescence device related to one embodiment of the present invention.
Figure 2:
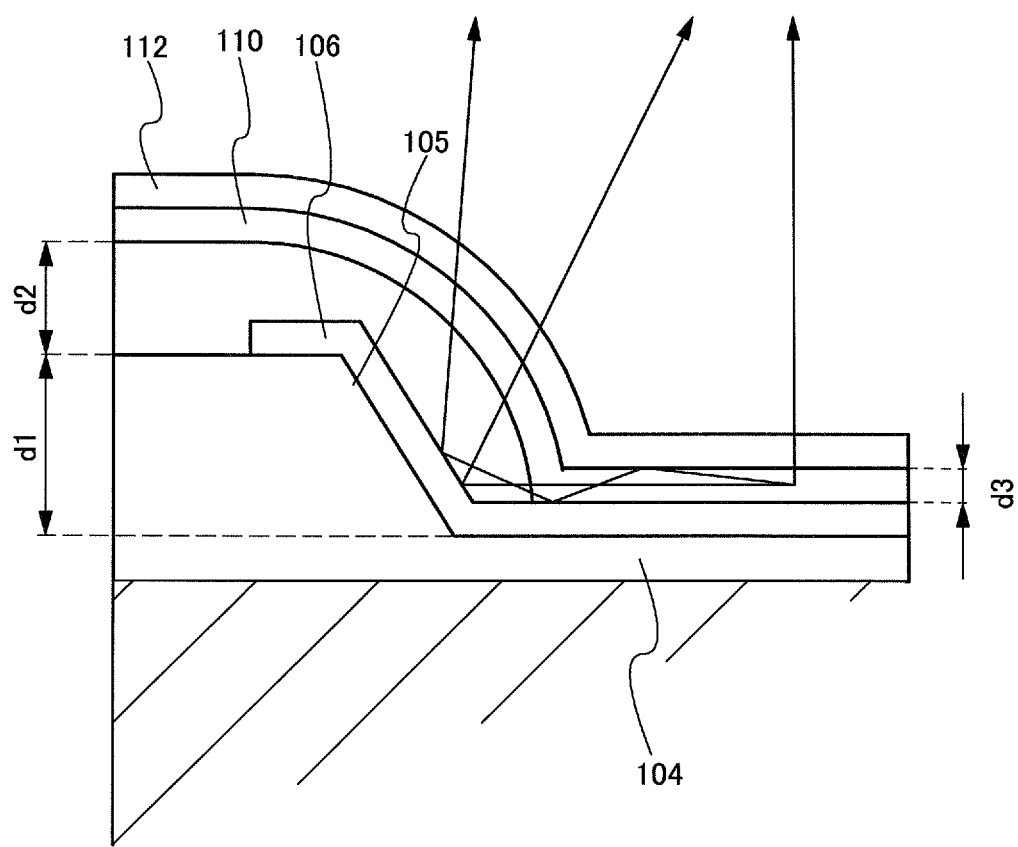
FIG. 2 is a diagram for showing the appearance of a parallel emitted component in the organic EL layer being reflected at a peripheral area of a first electrode in the electroluminescence device related to one embodiment of the present invention.

The electroluminescence device related to the present embodiment is explained while referring to FIG. 1A, FIG. 1B and FIG. 2. FIG. 1A shows a light emitting area of the electroluminescence device and a planar view of a peripheral area and a cross-sectional structure in the line A-A' shown in FIG. 1A is shown in FIG. 1B.

An insulating layer 104 is provided in a substrate 102. The insulating layer 104 does not have a uniform flat surface but includes a stepped portion 105. The stepped portion 105 of the insulating layer 104 includes a titled surface and the surface height of the insulating layer 104 in an inner side area and outer side area of the stepped portion 105 is different. It can be seen that if the inner side area of the stepped portion 105 of the insulating layer 104 is used as a reference, the surface of the outer side area of the stepped portion 105 is in a high position, and if the outer side area of the insulating layer 104 is used as a reference, the surface of the inner side area of the stepped portion 105 is in a low position.

The insulating layer 104 in such forms can be fabricated by forming an insulating film comprised from an insulating material such as silicon dioxide ($SiO_2$) or silicon nitride ($Si_3N_4$) using a plasma CVD method or sputtering method and then performing an etching process. The stepped portion 105 is formed by forming a mask from a resist material on the insulating film, and it is possible to provide a certain angle to the tilted surface by performing anisotropic etching while etching the mask (while reducing the end portion of the mask).

A first electrode 106 is provided over the insulating layer 104. The first electrode 106 is formed over the insulating layer 104, from the inner side area of the stepped portion 105 to at least the titled surface of the stepped portion 105. That is, the first electrode 106 has a form wherein the outer side area is curved with respect to the inner side area. If the outer side peripheral part of the first electrode 106 is used as a reference, it can be seen that inner side area has a depressed flat surface.

A bank layer 108 includes the stepped portion 105 in the insulating layer 104 and is formed to cover an end portion of the first electrode 106. An organic EL layer 110 is formed from the surface of the first electrode 106 to the surface of the bank layer 108 and over this is provided a second electrode 112. The organic layer 110 may also be formed from either a low molecular or high molecular organic material. For example, in the case where a low molecular organic material is used, the organic EL layer 110 is formed including a hole transport layer or electron transport layer with a light emitting layer provided there between in addition to the light layer which includes an organic material with light emitting properties. The thickness of the organic EL layer 110 is about 100 nm to 200 nm even when the film thickness of each layer is added together. As a result, when an end portion of the first electrode 106 is exposed as it is, because the organic EL layer 110 can not sufficiently cover this end portion, if the second electrode 112 is formed over this, the second electrode shorts with the first electrode 106. The bank layer 108 is for preventing the occurrence of such defects and it is preferred to be formed to cover an end portion of the first electrode 106 and having a curved shaped surface so that the organic EL layer 110 is formed as uniform as possible.

This type of bank layer 108 is formed from an inorganic insulating material such as silicon dioxide ($SiO_2$) or silicon nitride ($Si_3N_4$) or an organic insulating material such as an acryl resin or polyimide resin. For example, if a photosensitive organic resin material is used, it is possible to provide an upper end portion with a round shape or band shape by appropriately adjusting exposure time or development time.

The first electrode 106 is formed from the inner side area of the insulating layer 104 to the stepped portion 105 and thereby includes a structure where the outer periphery end portion is curved. As a result, the bank layer 108 is provided to cover an area where the first electrode 106 is curved, that is, the stepped portion 105 of the insulating layer 104, thereby the film thickness of the organic EL layer 110 becomes thin and the first electrode 106 and second electrode 112 do not short in an area where the stepped portion 105 is present.

The organic EL layer 110 and the second electrode 112 are formed in this order over the first electrode 106 and these layers may also extend to over the bank layer 108. As described above, the bank layer 108 covers an end portion of the first electrode 106 including the stepped portion 105, thereby even if the organic EL layer 110 or second electrode 112 is formed larger than an area where the first electrode 106 is exposed, the first electrode 106 and second electrode 112 do not short.

In the electroluminescence device shown in FIG. 1A and FIG. 1B, an organic EL device 114 includes a structure wherein the first electrode 106, the organic EL layer 110 and second electrode 112 are stacked and an area where these three layers are stacked serves as a light emitting surface.

Here, if the first electrode 106 serves as a light reflective electrode and the second electrode 112 serves as an optical transparency electrode, an upper surface emitting type (also called a top emission type) structure is formed whereby the light emitted in the organic EL layer 110 is emitted from the second electrode 112.

In the organic EL layer 114, one of the first electrode 106 and the second electrode 112 serves as an anode (electrode on the side where holes are injected) and the other includes a function of a cathode (electrode on the side where electrons are injected). Although the anode and cathode are formed from each type of conductive material, usually the anode is formed from a material with a higher work function with respect to the cathode.

In order to form the organic EL device as a top emission type device, the first electrode 106 is set as the anode and it is possible to apply a metal material such as titanium (Ta), titanium nitride (TiN), platinum (Pt), nickel (Ni), chrome (Cr) or tungsten (W) in order to use the anode as a reflective electrode. However, because these metals have a low refractive index compared to aluminum (Al) or silver (Ag), it is preferred to arrange a multilayer structure by arranging an indium/copper oxide (ITO) layer which has a high work function on a side which contacts the organic EL layer and arranging an aluminum (Al) or silver (Ag) layer which serves as a light emitting surface on a lower layer side thereon as a structure for further increasing the reflective ratio as a reflective electrode.

In order to use the second electrode 112 as the cathode, calcium (Ca) or magnesium (mg) or a material containing an alkali metal such as lithium (Li) may be used with aluminum (Al) for example. In addition, in order to provide translucency while continuing to use the second electrode 112 as the cathode, either the metal layer described above is formed thinly so as to allow light to pass through or preferably a transparent conductive film such as indium/copper oxide (ITO) or indium/copper zinc is stacked there upon.

In order to use the first electrode 106 as the anode and use this anode as a light reflective electrode, a metal material such as aluminum or silver (Ag) may be used as described above. In addition, in order use the second electrode 112 as the cathode and provide this cathode with translucency, a transparent conductive film such as indium/copper oxide (ITO) or indium/copper zinc may be used.

In this top emission type electroluminescence device, the organic EL device 114 emits light between the first electrode 106 and the second electrode 112 in the organic EL device 114 when an appropriate current is supplied over a light emitting threshold current. Light which is emitted within the organic EL layer 110 is emitted in all $4\pi$ directions when expressed as a solid angle.

FIG. 2 shows a schematic of an emission path of light emitted in the organic EL layer 110. Among the light emitted in the organic EL layer 110, light emitted in a roughly perpendicular direction (referred to below as perpendicular emitted component) to the second electrode 112 side passes through the second electrode 112 and is emitted to the exterior. In addition, it is thought that light emitted to the first electrode 106 side is reflected by a light reflecting surface of the first electrode 106 and the roughly perpendicular component of the reflected light is similarly emitted to the exterior.

However, among the light emitted in the organic EL layer 110, light of a parallel emitted component (that is, light emitted roughly parallel to the organic EL layer 110 and all light reflected at a boundary surface between the organic EL layer 110 and first electrode 106 or the second electrode 112) is usually lost without being emitted from the second electrode 112. However, in the electroluminescence device shown in the present embodiment, because the first electrode 106 extends as a reflective electrode up to the stepped portion 105 of the insulating layer 104 formed higher than the film thickness of the organic EL layer 110, light is reflected by this part and can be emitted to the second electrode 112 side. That is, a curved part in the outer periphery part of the first electrode 106 includes a function for reflecting light wave guided through the interior of the organic EL layer 110.

In order to develop this type of function, it is preferred that the bank layer 108 which covers the end portion of the first electrode 106 and the stepped portion 105 of the insulating layer 104 have translucency. Since the stepped portion 105 of the insulating layer 104 is used for forming a reflection surface for light wave guided through the interior of the organic EL layer 110, the amount of light of the parallel emitted component reflected by this light reflecting surface becomes larger the higher the stepped portion 105. Therefore, the height of the stepped portion 105 formed in the insulating layer 104 is preferred to be higher than the thickness of the organic EL layer 110. For example, when the height of the stepped portion 105 is given as d1, it is preferred that the value of d1 be sufficiently larger than a film thickness d3 of the organic EL layer 110 and d1 have a value 10 time or more with respect to d3.

In order to effectively emit wave guided light reflected by the light reflecting surface of the first electrode 106 formed by the stepped portion 105, from the second electrode 112 side, it is preferred to reduce the value of d2 lower than d1 when the thickness of the bank layer 108 is given as d2 in order to reduce the loss of absorbed light in the bank layer 108. That is, the height of the stepped portion provided in the insulating layer is preferred to be the same or higher than the thickness of the bank layer.

In order to efficiently extract light to the exterior, the titled angle of the stepped portion 105 in the insulating layer 104 may be formed from 30 degrees to 60 degrees and preferably around 45 degrees. Furthermore, the stepped portion 105 is not limited to a straight line shaped tilted surface as shown in the drawings but may be a curved tilted surface such as a quadratic curve when seen from a cross sectional structure.

In this way, according to the electroluminescence device shown in FIG. 1 A and FIG. 1B, the parallel emitted component among the light emitted in the organic EL layer 110 is reflected by the light reflecting surface of the first electrode 106 provided along the stepped portion 105 of the insulating layer 104 and is emitted to the second electrode 112 side. As a result, it is possible to increase the extraction efficiency of light generated in the organic EL layer 110. It is possible to further increase the extraction efficiency of light by arranging this light reflecting surface across the entire outer periphery of the first electrode 110.

According to the present embodiment, it is possible to form a light reflecting surface which curves towards a second electrode side by provided a peripheral area of a first electrode along a stepped portion of an insulating layer. Among the light emitted by an organic EL layer, it is possible to reflect light of a parallel emitted component emitted roughly perpendicular to the organic EL layer using a light reflecting surface provided over a peripheral part of a first electrode and emit the light from the second electrode side.

According to the present embodiment, by forming an insulating layer having a stepped portion as described above and forming a peripheral area of a first electrode along this stepped portion, it is possible to form a light reflecting surface with respect to light of a parallel emitted component emitted in an organic electroluminescence layer.

Figure 3:
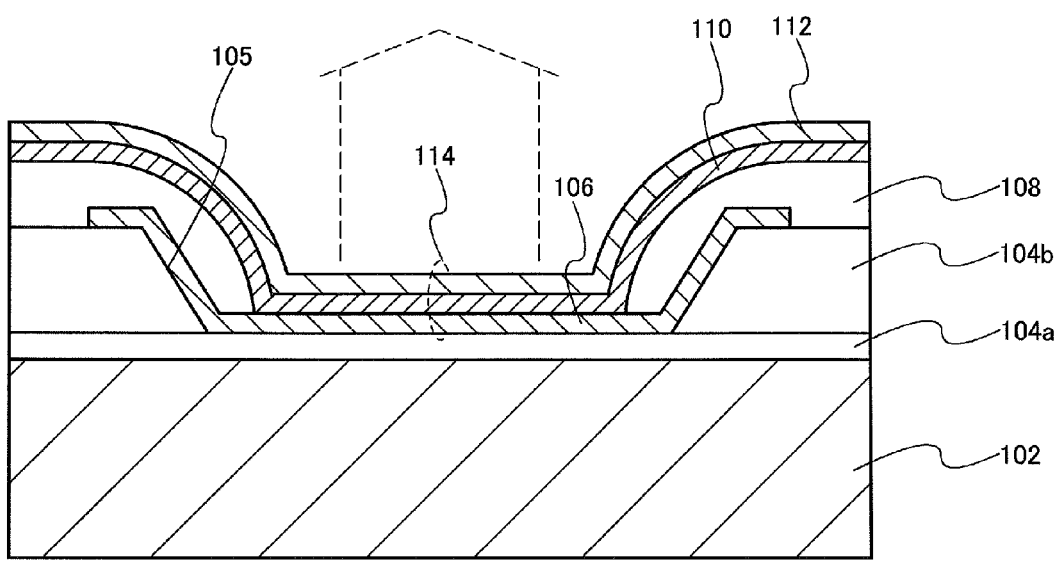
FIG. 3 is an electroluminescence device related to one embodiment of the present invention and shows a different form of a stepped portion.

FIG. 3 shows an electroluminescence device in which the structure of the insulating layer over a lower layer side of the first electrode 106 is different to that shown in FIG. 1A and FIG. 1B. In FIG. 3, a first insulating layer 104a is provided over a substrate 102, and a second insulating layer 104b is provided stacked over the first insulating layer 104a. A stepped portion 105 is formed by arranging the second insulating layer 104b to protrude from the first insulating layer 104a. It is possible to provide the stepped portion 105 with a titled surface by providing a side surface of the second insulating layer 104b with a taper shape.

By changing the material of the first insulating layer 104a and the second insulating layer 104b, control of the shape of the second insulating layer 104b, that is, control of the height of the stepped portion 105 or control of the angle of the tilted surface becomes easy. For example, if the first insulating layer 104a is formed using silicon nitride ($Si_3N_4$) and the second insulating layer 104b is formed using silicon dioxide ($SiO_2$), it is possible to etch process the second insulating layer 104b with relatively good selectivity. Furthermore, selection of an insulating material may be a combination of this in reverse. In addition, the second insulating layer 104b may be formed from a similar organic resin material to the bank layer 108.

In this way, by arranging the second insulating layer 104b over the first insulating layer 104a and selectively processing the second insulating layer 104b, shape control of the stepped portion 105 becomes easy. The remaining structure is the same as that explained using FIG. 1B and FIG. 2 and it is possible to demonstrate the same operation and effects in the electroluminescence device shown in FIG. 3.

Figure 4A:
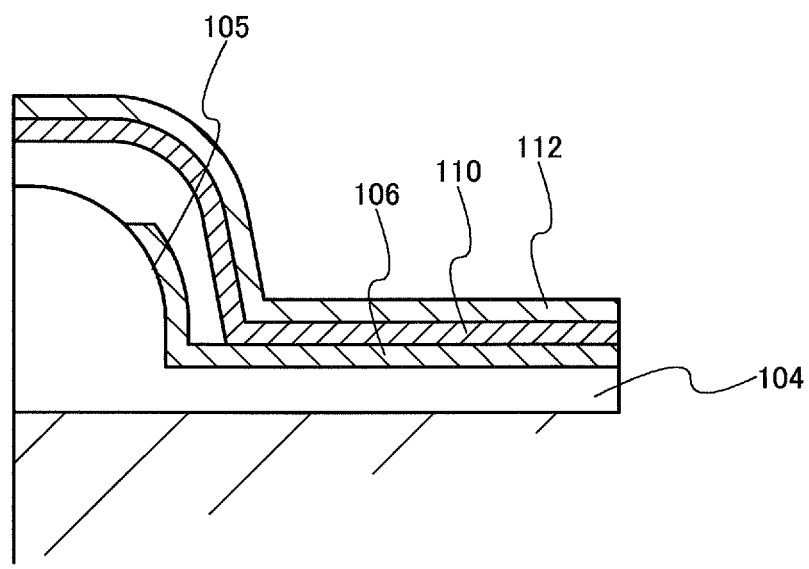
FIG. 4A shows an electroluminescence device related to one embodiment of the present invention and explains a modified example of the form of the stepped portion.
Figure 4B:
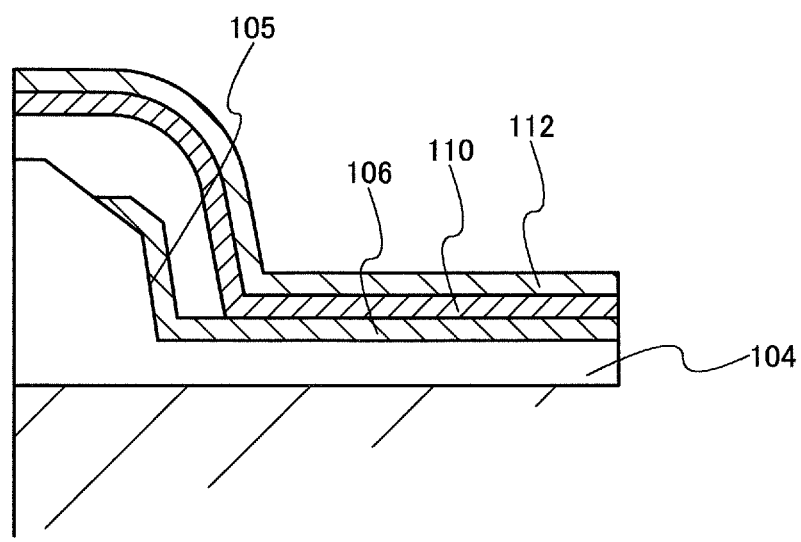
FIG. 4B shows an electroluminescence device related to one embodiment of the present invention and explains a modified example of the form of the stepped portion.
Figure 4C:
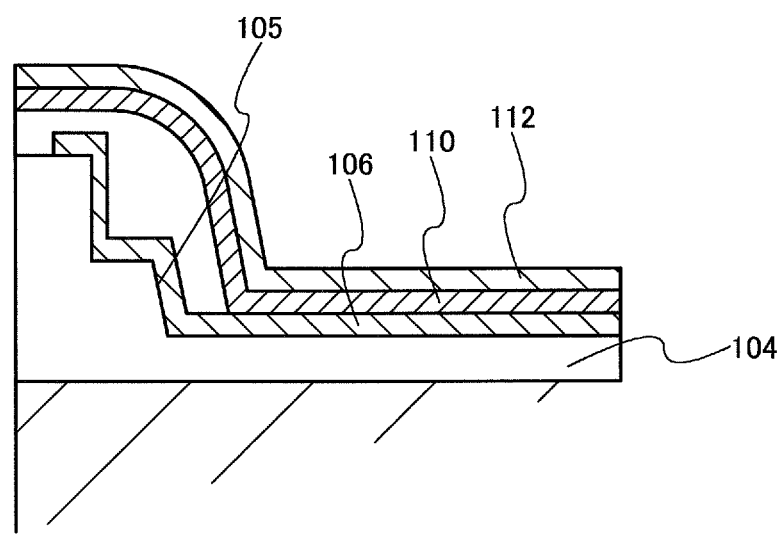
FIG. 4C shows an electroluminescence device related to one embodiment of the present invention and explains a modified example of the form of the stepped portion.

The form of the stepped portion 105 in the insulating layer 104 provided over a lower layer side of the first electrode 106 is not limited to that shown in FIG. 1A, FIG. 1B and FIG. 3. Other forms are also possible if it is possible to reflect light wave guided through the organic EL layer 110. FIG. 4A to FIG. 4C shows other examples of forms of the stepped portion 105 in the insulating layer 104.

FIG. 4A shows an example of a curved surface structure of the stepped portion 105 in which a titled angle consecutively changes. By forming the shape of the stepped portion into a curved surface shape, the light reflecting surface of the first electrode 106 formed along this surface is also provided with a curved surface shape and it is possible to change the direction of reflection (scattering) by the light injection position. In addition, because an upper surface has a curved surface shape, even if the thickness of the bank layer 108 is formed thin, it is possible to sufficiently cover the stepped portion 105.

FIG. 4B shows the form whereby the angle of the tilted surface of the stepped portion 105 changes midway and the tilted angle on a lower stage and the tilted angle on an upper stage are different. In the example shown in FIG. 4B, the tilted angle on a lower stage is large (nearly perpendicular) and the tilted angle on an upper stage is small. Even with this structure of the stepped portion 105, because the angle of the light reflecting surface in the first electrode 106 formed along this surface also changes, it is possible to change the direction of reflection (scattering) by the light injection position.

FIG. 4C shows the stepped portion 105 with a multi-stage structure. By adopting such a structure, it is possible to increase the height of the stepped portion 105. In this way, it is possible to increase the area of the light reflecting surface in the first electrode 106 formed along the surface of this stepped portion 105, and prevent to a maximum guided wave light of the organic EL layer 110 from leaking in a horizontal direction.

The structure of the stepped portion 105 shown in FIG. 4A to FIG. 4C can be applied to the electroluminescence device shown in FIG. 1A, FIG. 1B and FIG. 3.

[Second Embodiment]

Figure 5:
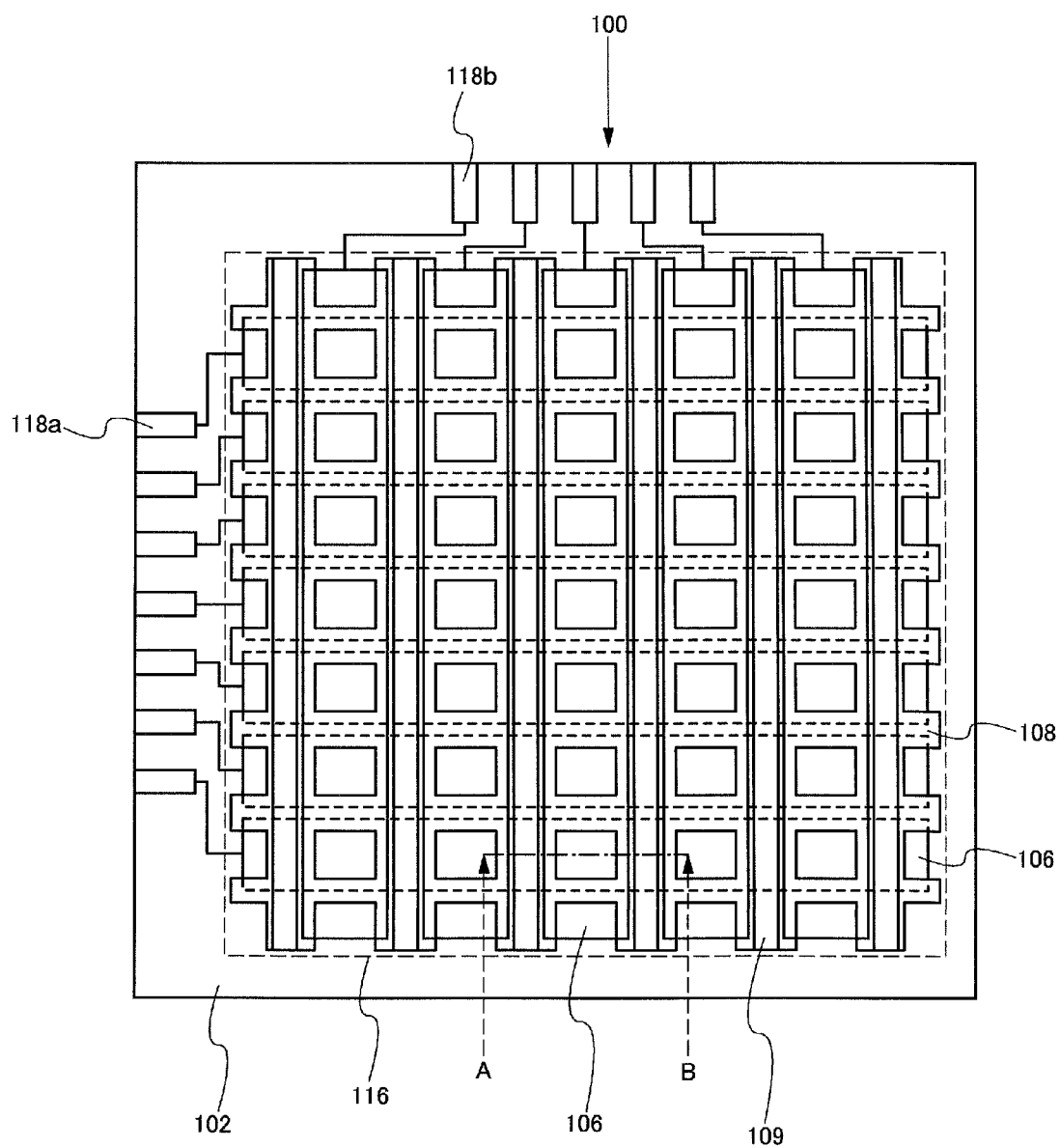
FIG. 5 is an electroluminescence device related to one embodiment of the present invention and is a planar view diagram showing the structure of a pixel including an organic EL device provided in a matrix shape.
Figure 6A:
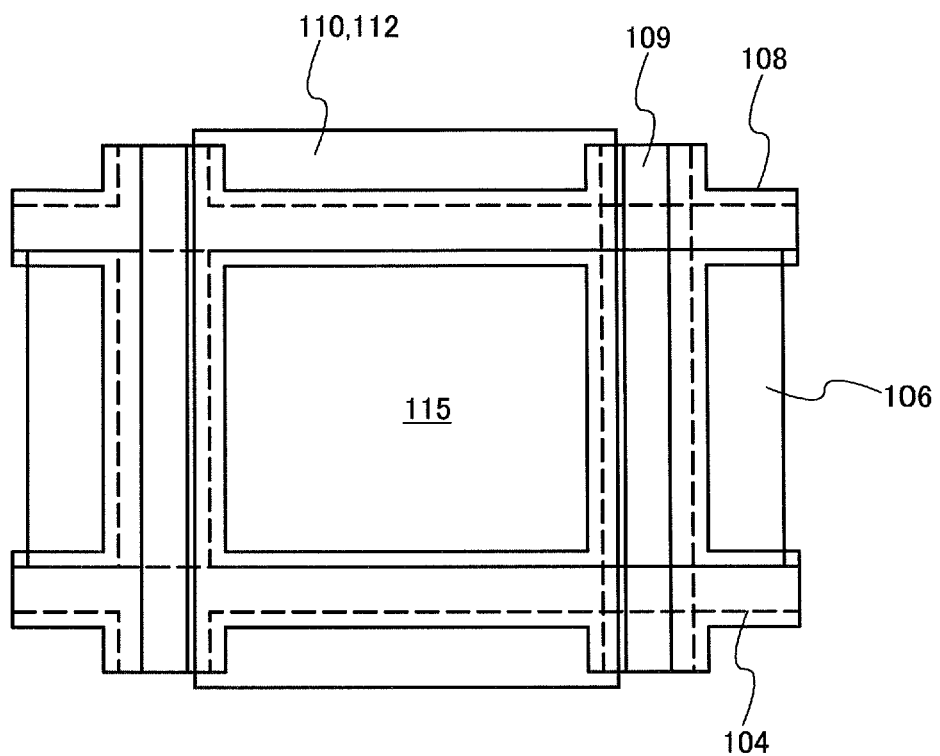
FIG. 6A is a planar view diagram of an electroluminescence device related to one embodiment of the present invention.
Figure 6B:
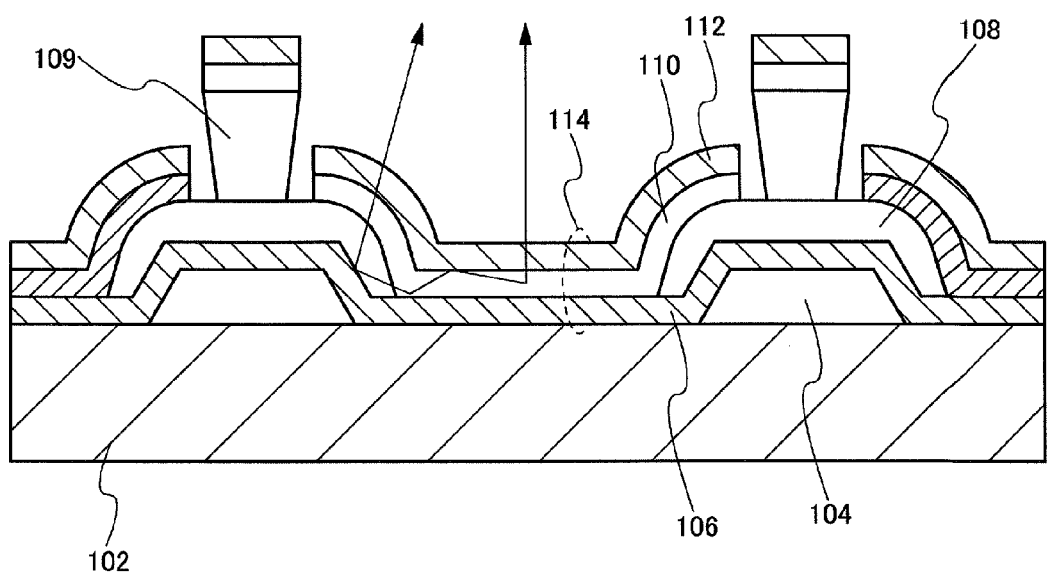
FIG. 6B is a cross-sectional diagram of an electroluminescence device related to one embodiment of the present invention.

An electroluminescence device related to the present embodiment is explained while referring to FIG. 5, FIG. 6A and FIG. 6B. In the present embodiment, one form of an electroluminescence device using a plurality of organic EL devices 14 is explained.

FIG. 5 shows a planar view of an electroluminescence device 100 and includes a pixel area 116 with a pixel including an organic EL device provided in a matrix shape. The first electrode 106 is formed in a stripe shape (or band shape) in the pixel area 116. The organic EL layer 110 and second electrode 112 are also formed in a stripe shape (or band shape) and this stripe is provided to intersect with the first electrode 116. In addition, an organic EL layer 114 is formed over an intersection part of the organic EL layer 110 and the second electrode 112.

The bank layer 108 is provided to cover an end portion of the first electrode 106, and is also formed in a direction in which the stripe pattern extends the organic EL layer 110 and second electrode 112 cutting horizontally over the first electrode 106 so as to separate pairs of adjacent organic EL devices. An insulating layer which forms a stepped portion is provided to be buried in the bank layer 108. The first electrode 106 is connected to a terminal 118*a* provided in a peripheral area of the substrate 102, and the second electrode 112 is connected to a terminal 118*b*. When an appropriate current more than a light emitting threshold current is supplied between these terminals, the organic EL device 114 located in a position where the first electrode 106 and second electrode 112 intersect emits light.

The pixel 115 in the pixel area 116 is shown in more detail in FIG. 6A and FIG. 6B. FIG. 6A is a planar view of the pixel 115 and a cross sectional view corresponding to the line A-B in FIG. 6A is shown in FIG. B. The insulating layer 104 is provided over the substrate 102. The insulating layer 104 includes a pattern wherein an area in which the organic EL device 114 is formed is open. Since a surface of the insulating layer 104 is higher than the surface of the substrate 102 by a film thickness amount, an aperture part is formed in the insulating layer 104 and thereby the stepped portion 105 is formed there.

The first electrode 106 which extends in a stripe shape is formed along the stepped portion 105 of the insulating layer 104 over the substrate 102. The first electrode 106 is an electrode with light reflecting properties, and when an area in an upper flat surface of the substrate 102 is set as a main surface, the electrode includes a light reflecting surface which curves in a different direction to the main surface in the stepped portion 105.

The bank layer 108 is provided to cover the insulating layer 104. That is, the bank layer 108 is provided so as to bury the curved light reflecting surface of the stepped portion 105 and first electrode 106. The second electrode 109 is provided extending in the direction intersecting with the first electrode 106 which extends in a stripe shape over the bank layer 108. Referring to FIG. 6B, a second bank layer 109 is preferred to have a wedge shape so that the width of an upper surface part becomes wider than the width of an area in contact with the bank layer 108.

The organic EL layer 110 and the second electrode 112 are provided with a stripe shape in order to extend in a roughly parallel direction with the second bank layer 109. The second bank layer 109 includes the shape described previously thereby, the stripe pattern of the organic EL layer 110 and the second electrode 112 includes the function of a device separation layer so that pairs of adjacent components are insulated.

The organic EL device 114 is formed in an area where the first electrode 106, the organic EL layer 110 and second electrode 112 overlap. The first electrode 106 is an electrode with light reflecting properties and if the second electrode 112 is an electrode having translucency, light is emitted to the second electrode 112 side. As is shown in FIG. 5, if the organic EL device 114 is provided in a matrix shape as a pixel, it is possible to obtain a top emission type electroluminescence device.

As is schematically shown in FIG. 6B, the organic EL device 114 emits light when a device is applied so that an appropriate current over a light emitting threshold current flows between the first electrode 106 and second electrode 112. The light emitted by the organic EL layer 110 is emitted in all $4\pi$ directions when expressed as a solid angle. Among the light emitted by the organic EL layer 110, light of a perpendicular emitted component is passes through the second electrode 112 and is emitted to the exterior. In addition, light emitted to the first electrode side is reflected by the light reflecting surface of the first electrode 106 and the roughly perpendicular component of the reflected light is similarly emitted to the exterior.

Among the light emitted by the organic EL layer 110, light of a parallel emitted component is reflected by the light reflecting surface in the curved part (part formed along the stepped portion 105) of the first electrode 106, and can be emitted to the second electrode 112 side. As a result, because it is possible to effectively utilize the light of the parallel emitted component which could not be conventionally used as light emitted to the exterior, it is possible to improve the extraction efficiency of light.

In addition, by forming a light reflecting surface by the stepped portion 105 and first electrode 106 between adjacent organic EL devices 114, it is possible to prevent light of a parallel emitted component generated within the organic EL layer 110 from propagating as leaked light to an adjacent device area. In this way, in the case where an image is displayed in a pixel area of an electroluminescence device, it is possible to remove the problem of mixed colors of light generated between adjacent pixels.

In order to obtain these advantageous effects, the height of the stepped portion 105 is preferred to be larger than the width of an organic EL layer. In order to reduce light absorption loss in the bank layer 108, the thickness of the bank layer 108 is preferred to be smaller than the height of the stepped portion 105. Furthermore, in order to efficiently extract light of a parallel emitted component in the light reflecting surface in the curved part of the first electrode 106, the tilted angle is preferred to be set from 30 degrees to 60 degrees and more preferably about 45 degrees. Furthermore, the stepped portion 105 is not limited to the straight line shaped tilted surface as shown in the drawings. The titled surface may also be curved such as a quadratic curve when seen from a cross sectional structure.

In the electroluminescence device shown in FIG. 5, a plurality of striped shaped organic EL layers 110 may be made to display monochrome using a single light emitting material, and it is possible to arrange pixels which emit light in each color red (R), green (G) and blue (B) or further arrange a pixel emitting white (W) light to display color.

In the electroluminescence device related to the present embodiment, the parallel emitted component among the light emitted by the organic EL layer 110 is reflected by the light reflecting surface of the first electrode 106 provided along the stepped portion 105 of the insulating layer 104 and is emitted to the second electrode 112 side. In this way, even if a current flowing to an organic EL device is not increased, it is possible to increase luminosity when emitting light compared to a conventional example. As a result, it is possible to reduce deterioration of an organic EL device and reduce power consumption of an electroluminescence device.

According to the present embodiment, it is possible to reflect light of a parallel emitted component among light emitted by an organic EL layer by a light reflecting surface (light reflecting surface curved towards the second electrode side) provided over a peripheral part of the first electrode, and emit the light from the second electrode side. This light reflecting surface provided over a peripheral part of a first electrode can prevent light of a parallel emitted component diffusing to an adjacent pixel.

In the present embodiment, the height of a stepped portion provided in an insulating layer is preferred to be larger than the width of an electroluminescence layer. Alternatively, the height of a stepped portion provided in an insulating layer is preferred to be the same or more than the thickness of a bank layer. In addition, a protruding part may be provided over an upper side surface of a stepped portion provided in an insulating layer.

By setting the height of a stepped portion provided in an insulating layer as described above, it is possible to sufficiently provide an area for a light reflecting surface in a peripheral area of a first electrode. It is possible to increase the area where light of a parallel emitted component among the light emitted by an organic electroluminescence layer is irradiated and increase the reflection light of the parallel emitted component.

In the present embodiment, a stepped portion provided in an insulating layer is preferred to be provided so as to be buried in a bank layer.

By covering an area formed with a stepped portion in a peripheral area of a first electrode using an optical transparency bank layer, it is possible to prevent a second electrode provided over an organic electroluminescence layer from shorting with a first electrode.

According to the present embodiment, even in the case of an active drive type formed with a thin film transistor, by forming a stepped portion in an insulating layer and forming a peripheral area of a first electrode along this stepped portion, it is possible to form a light reflecting surface with respect to light of a parallel emitted component emitted by an organic electroluminescence layer, over a peripheral part of the first electrode.

In the present embodiment, a stepped portion in an insulating layer may be formed by digging a surface of the insulating layer as a first main surface and forming a second main surface at a higher position than the first main surface. According to this manufacturing method, it is possible to easily form a stepped portion by etching an insulating layer.

In the present embodiment, a stepped portion may be formed by further selectively forming an insulating layer over an insulating layer. In addition, a protruding part may be provided over a stepped portion formed in the insulating layer. According to this manufacturing method, it is possible to the height of a stepped portion according to the film thickness of an insulating layer (or protruding part) formed later.

In the present embodiment, the height of a stepped portion in an insulating layer is preferred to be formed higher than the width of an electroluminescence layer. Alternatively, the height of a stepped portion in an insulating layer is preferred to be formed the same of higher than the width of a bank layer.

By forming the height of a tilted surface provided in an insulating layer as described above, it is possible to sufficiently provide an area for a light reflecting surface in a peripheral area of a first electrode. It is possible to increase an area where light of a parallel emitted component among light emitted by an organic electroluminescence layer is irradiated, and increase the reflection light of a parallel emitted component.

[Third Embodiment]

A form of an active drive type electroluminescence device using a thin film transistor as a drive switch is explained while referring to FIG. 7 to FIG. 10.

Figure 7:
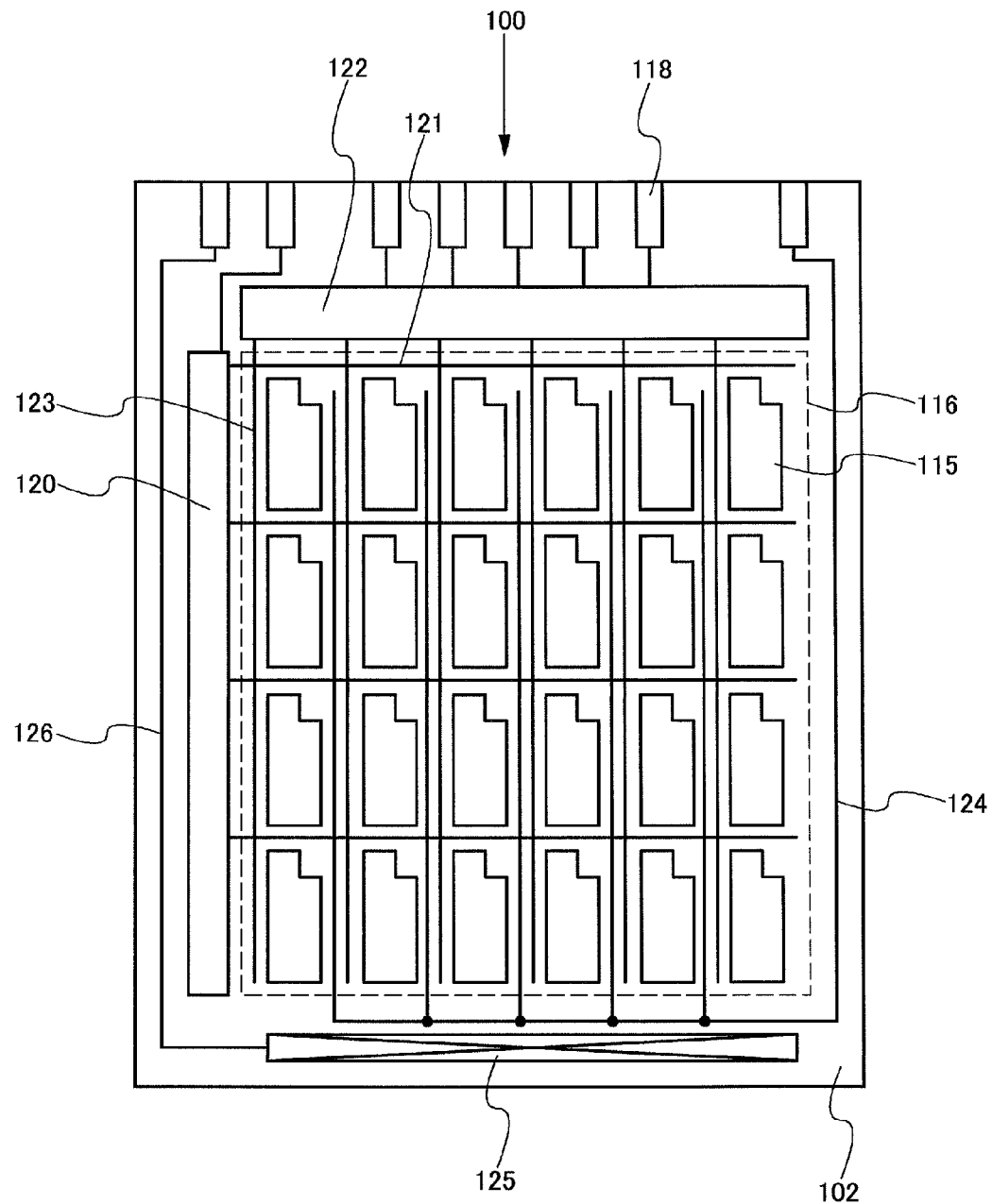
FIG. 7 is an electroluminescence device related to one embodiment of the present invention and is a planar view diagram showing the structure of a pixel including an organic EL device provided in a matrix shape.

FIG. 7 is a block diagram showing the structure of an active drive type electroluminescence device. The electroluminescence device 100 is provided with a pixel area with pixels 115 provided in a matrix shape in a row and column direction, a gate signal line drive circuit 120, and a data line signal drive circuit 122 in a substrate 102.

A signal output from the gate signal line drive circuit 120 is provided to a gate signal line 121, and a data signal output from the data signal line drive circuit 122 is provided to a data signal line 123. The gate signal line 121 and data signal line 123 are provided to intersect in a pixel area 116, and a signal is provided to each pixel 115 provided in a matrix shape respectively. A thin film transistor provided with a signal from the gate signal line 121 and data signal line 123, and an organic EL device wherein a light emitting state or non-light emitting state is controlled by the thin film transistor, are provided in the pixel 115.

In addition, a power supply line which supplies a current to an organic EL device, and a common line 126 which provides a common potential to one electrode in a an organic EL device in each pixel are provided in the pixel area 116. The common line 126 is connected to one electrode in an organic EL device in the pixel area 116 or a common contact 127 provided in that vicinity. Apart from a plurality of terminals input with a signal to be sent to the gate signal line drive circuit 120 and data signal line drive circuit 122, a power supply input terminal connected to the power supply line 124 and a common input terminal which provides a common potential to the common line 126 are included in an input terminal 118 provided over an end of the substrate 102.

In the electroluminescence device shown in FIG. 7, a light emitting color of an organic EL device provided in each pixel may be made to display monochrome using a single color, and it is possible to arrange an organic EL device which emit light in each color red (R), green (G) and blue (B) in each pixel or further arrange a pixel emitting white (W) light to display color.

Figure 8:
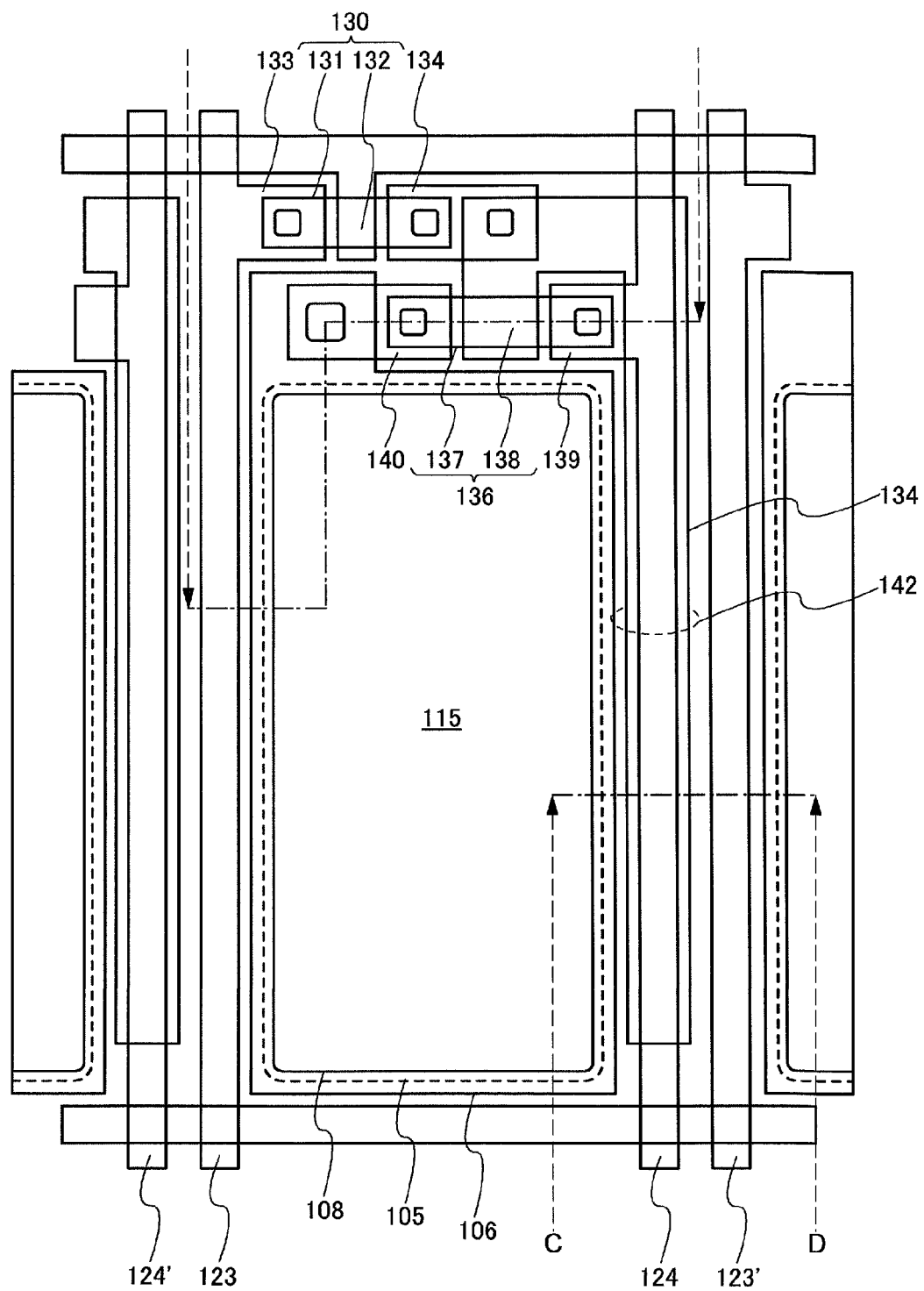
FIG. 8 is an electroluminescence device related to one embodiment of the present invention and shows a planar view for explaining the details of the pixel shown in FIG. 7.

FIG. 8 is a planar view diagram showing an example of a pixel 115. The pixel 115 includes a selection transistor 130, a drive transistor 136 and a capacitor device 142. The selection transistor 130 includes a gate electrode 132 which overlaps a semiconductor layer 131, and the gate electrode 132 is connected to the gate signal line 121. In addition, a source/drain electrode 133 is connected to the data signal line 123 and another source/drain electrode 134 is connected to a gate electrode 137 of a drive transistor 138. The drive transistor 136 includes a semiconductor layer 137 overlapping the gate electrode 138, a source/drain electrode 139 is connected to the power supply line 124, and another source/drain electrode 140 is connected to the first electrode 106. The capacitor device 142 is formed by a capacitor electrode 143 formed in the same layer the gate electrode 137, and the power supply line 124 overlapping the capacitor electrode 143 with an insulating layer there between, and provided so as to extend along the power supply line 124.

Figure 9:
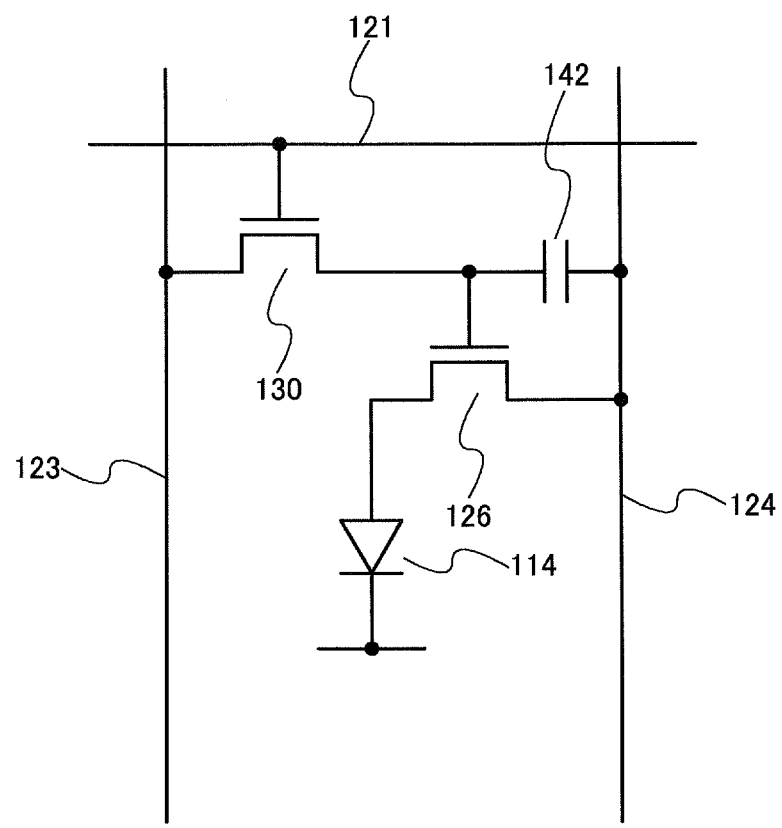
FIG. 9 is an electroluminescence device related to one embodiment of the present invention and shows an equivalent circuit of the pixel shown in FIG. 8.

FIG. 9 shows an equivalent circuit of the pixel shown in FIG. 8. When the gate signal line 121 is provided with a selection signal, the selection transistor 130 synchronizes a data signal provided from the data signal line 123 with this selection signal and provides the data signal as a gate potential of the drive transistor 136, and the capacitor device 142 stores this gate potential. The drive transistor 136 which is connected to the power supply line 124 supplies a drain current to the organic EL device 114 based on this gate potential. The organic EL device 114 emits light at a luminosity based on this drain current.

Furthermore, the layout of the pixel shown in FIG. 8 and the equivalent circuit of the pixel shown in FIG. 9 are examples and the electroluminescence device of the present invention is not limited to this type of pixel and circuit structure. For example, a circuit compensating a threshold voltage of the drive transistor 136 or a switching transistor which forcibly ends light being emitted by an organic EL device may be further added.

Figure 10:
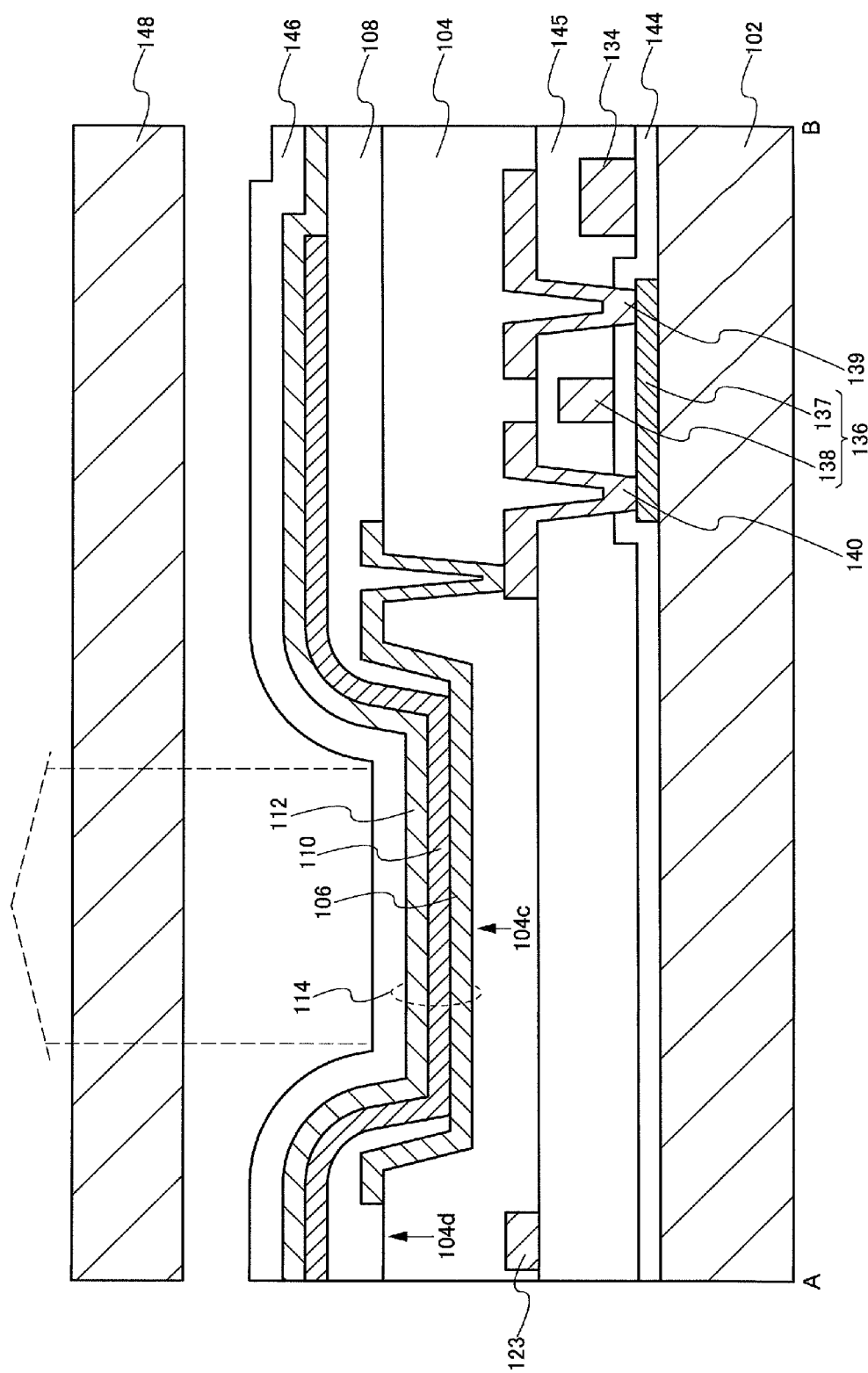
FIG. 10 is an electroluminescence device related to one embodiment of the present invention and shows a cross-sectional structure of the pixel shown in FIG. 7.
Figure 11:
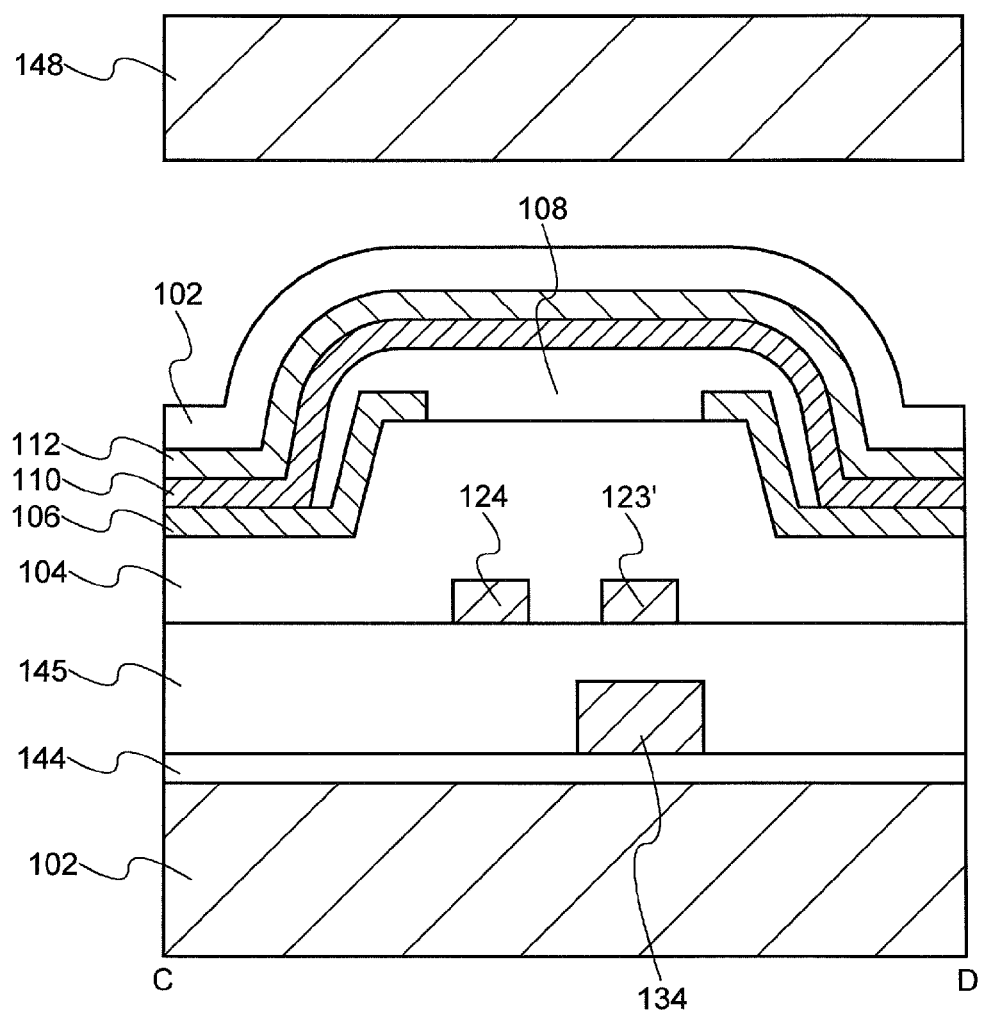
FIG. 11 is an electroluminescence device related to one embodiment of the present invention and shows a cross-sectional structure of a part where pairs of pixels shown in FIG. 7 are adjacent.

Although FIG. 8 shows a planar structure of a pixel 114, a light reflecting surface is provided in a peripheral part of the first electrode 106 so as to protrude to an upper part with respect to a substantially flat surface in an inner side area of the electrode. In addition, the bank layer 108 having optical transparency properties is provided so as to cover this light reflecting surface. This structure is shown as a cross sectional structure corresponding to the line A-B in FIG. 8 is shown in FIG. 10 and a cross sectional structure corresponding to the line C-D is shown in FIG. 11. Furthermore, although an organic EL layer provided on roughly the entire surface of a pixel or the second electrode is omitted in FIG. 8, these are included in FIG. 10 and FIG. 11.

In FIG. 10, the drive transistor 136 includes an insulating gate type structure and a gate insulating layer 144 is provided between the semiconductor layer 137 and gate electrode 138. Furthermore, although the thin film transistor shown in FIG. 10 shows a top gate type structure, the thin film transistor is not limited to this structure. For example, the thin film transistor may be a bottom gate type transistor and may be similarly applied in the electroluminescence device related to the present embodiment.

Although the material which forms the semiconductor layer 137 of the drive transistor 136 is not limited, if for example the material is a polycrystalline silicon film, it is possible to form a self-aligned source area and drain area with the gate electrode 138 as a mask. At this time, in order to activate n type impurities or p type impurities added to the source area and drain area, a thermal process of about 450° C.~550° C. is required. In order to achieve this, it is preferred to form the gate electrode 138 using a metal material originally having heat resistance properties, for example using molybdenum, tungsten, tantalum or an alloy material using a plurality of types of these elements. The capacitor electrode 143 is formed using the same conductive layer as the gate electrode 138.

An interlayer insulating film 145 is provided over an upper layer of the gate electrode 138. The source/drain electrodes 139 and 140 are connected with a source area and drain area of the semiconductor layer 137 by a contact hole provided in the interlayer insulating film 145. As is shown in the planar view in FIG. 8, the source/drain electrode 139 is formed so as to be continuous from the power supply line 124. However, the source/drain electrode 140 is connected with the first electrode 106 provided over the insulating layer 104 via a contact hole provided in the insulating layer 104.

The first electrode 106 is formed along a surface shape of the insulating layer 104. The insulating layer 104 includes the stepped portion 105 so that a peripheral area of the first electrode 106 curves in an upwards direction. In other words, the insulating layer 104 includes a tilted surface which opens in an upwards direction towards a substantially flat first main surface 104c, and a second main surface 104d in a higher position than the first main surface 104c. In addition, the first electrode 106 is formed to this stepped portion 105 from at least the first main surface 104c.

In order to form the first electrode 106 as an anode of the organic EL device and set the anode as a reflective electrode, it is possible to apply a metal material such as titanium (Ta), titanium nitride (TiN), platinum (Pt), nickel (Ni), chrome (Cr) or tungsten (W). However, because these metals have a low refractive index compared to aluminum (Al) or silver (Ag), it is preferred to arrange a multilayer structure by arranging an indium/copper oxide (ITO) layer which has a high work function on a side which contacts the organic EL layer and arranging an aluminum (Al) or silver (Ag) layer which serves as a light emitting surface on a lower layer side thereon as a structure for further increasing the reflective ratio as a reflective electrode.

The bank layer 108 includes the stepped portion 105 in the insulating layer 104 and is provided to cover a peripheral area of the first electrode 106. The organic EL layer 110 is formed from the surface of the first electrode 106 to the surface of the bank layer 108 and the second electrode 112 is provided over this.

The organic layer 110 may also be formed from either a low molecular or high molecular organic material. For example, in the case where a low molecular organic material is used, the organic EL layer 110 is formed including a hole transport layer or electron transport layer with a light emitting layer provided there between in addition to the light layer which includes an organic material with light emitting properties. The thickness of the organic EL layer 110 is about 100 nm to 200 nm even when the film thickness of each layer is added together. As a result, when an end portion of the first electrode 106 is exposed as it is, because the organic EL layer 110 can not sufficiently cover this end portion, if the second electrode 112 is formed over this, the second electrode shorts with the first electrode 106. The bank layer 108 is for preventing the occurrence of such defects and it is preferred to be formed to cover an end portion of the first electrode 106 and having a curved shaped surface so that the organic EL layer 110 is formed as uniform as possible.

The second electrode 112 is formed continuously cross a plurality of pixels, and serves as an electrode applied with a potential between a plurality of pixels with respect to the first electrode 106 which is applied by a separate potential by the drive transistor 136. A passivation film 132 provided over the second electrode 112 is formed from an insulating material such as silicon nitride ($Si_3N_4$) for example. An opposing substrate 148 is provided over the passivation film 146 so as to face the substrate 102. In addition, a sealing resin layer may also be formed between the passivation film 146 and the opposing substrate 148.

FIG. 11 shows a cross sectional diagram showing the structure of a part of a pixel adjacent to an adjacent pixel. By providing a peripheral area of the first electrode with a light reflecting surface which curves to the second electrode 112 side, light of a parallel emitted component among the light emitted by the organic EL layer 110 is prevented from being wave guided through the interior of the organic EL layer 110 and propagating to an adjacent pixel. As a result, in the case of displaying an image in a pixel area of an electroluminescence device, it is possible to remove the problem of mixing colors of light emitted between adjacent pixels.

The amount of light of a parallel emitted component emitted by the organic EL layer 110 reflected by a light reflecting surface provided in a peripheral area of the first electrode 106 increases the larger the area of the light reflecting surface. Therefore, the height of the stepped portion 105 is preferred to be larger than the film thickness of the organic EL layer 110 so that the area of the light reflection layer of the first electrode 106 becomes larger. Furthermore, it is preferred to be larger than the total film thickness of the organic EL layer 110 and the second electrode 112. In addition, it is preferred that the tilted angle of the tilted surface in the stepped portion 105 be set from 30 degrees to 60 degrees and more preferably about 45 degrees. Furthermore, the stepped portion 105 is not limited to a straight line shaped tilted surface as shown in the drawings but may be a curved tilted surface such as a quadratic curve when seen from a cross sectional structure. Furthermore, the form of the stepped portion may be appropriately replaced with the forms shown in FIG. 4A to FIG. 4C.

According to the electroluminescence device in the present embodiment, at least one part of the parallel emitted light among the light emitted by the organic EL layer 110 in the pixel 114 is reflected by a light reflecting surface provided in a peripheral part of the first electrode and is emitted from the second electrode having translucency. By arranging this type of reflection structure in a first electrode having light reflecting properties in each pixel, because the extraction efficiency of light in each pixel is improved, the light extraction efficiency is improved even when considering the entire electroluminescence device. Therefore, it is possible to reduce power consumption even when a pixel area is made to emit light at the same luminosity. In addition, by arranging this type of reflection structure in a first electrode, high luminosity with a low drive current can be obtained compared to a conventional example and thereby it is possible to reduce deterioration of an organic EL device.

What is claimed is:

1. An electroluminescence device comprising:
    an insulating layer over a substrate;
    a first electrode including a light reflecting surface over the insulating layer;
    a bank layer covering a peripheral area of the first electrode;
    an electroluminescence layer over the first electrode; and
    a second electrode having an optical transparency over the electroluminescence layer;
    wherein the insulating layer includes a stepped portion having a first main surface, a second main surface, and a tilted surface between the first main surface and the second main surface, the tilted surface curved towards a second electrode side in the peripheral area of the first electrode,
    the first electrode has an area which does not overlap the bank layer,
    the first main surface includes a first region facing the area and a second region intersecting at an angle to a first end of the tilted surface,
    the second main surface intersects at an angle to a second end of the tilted surface, the second end being opposite to the first end, and is located above an opposite side of the first main surface from the substrate, and
    the peripheral area of the first electrode is provided along the tilted surface of the stepped portion.

2. The electroluminescence device according to claim 1 wherein a height of the stepped portion provided in the insulating layer is larger than a thickness of the electroluminescence layer.

3. The electroluminescence device according to claim 1 wherein a height of the stepped portion provided in the insulating layer is the same as the thickness or more of the bank layer.

4. The electroluminescence device according to claim 1 wherein a protruding part is provided on the second main surface of the stepped portion provided in the insulating layer, the protruding part protruding from the second main surface to the second electrode side.

5. The electroluminescence device according to claim 1 wherein the stepped portion provided in the insulating layer is provided to be buried in the bank layer.

6. An electroluminescence device comprising:
    a pixel region having a plurality of pixels arranged in a matrix;
    each of the pixels including a thin film transistor, a first electrode including a light reflecting surface connected to the thin film transistor, an electroluminescence layer over the first electrode, and a second electrode having an optical transparency over the electroluminescence layer;
    an insulating layer above the thin film transistor, the first electrode being on and in physical contact with the insulating layer; and
    a bank layer covering a peripheral area of the first electrode,
    wherein the insulating layer includes a stepped portion having a first main surface, a second main surface, and a tilted surface between the first main surface and the second main surface, the tilted surface curved towards a second electrode side in the peripheral area of the first electrode,
    the first electrode has an area which does not overlap the bank layer,
    the first main surface includes a first region facing the area and a second region intersecting at an angle to a first end of the tilted surface,
    the second main surface intersects at an angle to a second end of the tilted surface, the second end being opposite to the first end, and is located above an opposite side of the first main surface from the substrate, and
    the peripheral area of the first electrode is provided along the tilted surface of the stepped portion.

7. The electroluminescence device according to claim 6 wherein a height of the stepped portion provided in the insulating layer is larger than a thickness of the electroluminescence layer.

8. The electroluminescence device according to claim 6 wherein a height of the stepped portion provided in the insulating layer is the same as the thickness or more of the bank layer.

9. The electroluminescence device according to claim 6 wherein a protruding part is provided over the second main surface of the stepped portion provided in the insulating layer, the protruding part protruding from the second main surface to the second electrode side.

10. The electroluminescence device according to claim 6 wherein the stepped portion provided in the insulating layer is provided to be buried in the bank layer.

11. The electroluminescence device according to claim 1, wherein the first electrode is in physical contact with the electroluminescence layer.

12. The electroluminescence device according to claim 1, wherein a second bank layer is located on the bank layer and has a stripe shape.

13. The electroluminescence device according to claim 12, wherein the second bank layer has a lower surface in physical contact with the bank layer and an upper surface opposite to the lower surface, and a width of the upper surface is wider than a width of the lower surface.

14. The electroluminescence device according to claim 13, wherein the second electrode is separated by the second bank layer, and a part of the second electrode is located above the upper surface.

15. The electroluminescence device according to claim 13, wherein the electroluminescence layer is separated by the second bank layer, and a part of the electroluminescence layer is located on the upper surface.

* * * * *